United States Patent
Ohki et al.

(10) Patent No.: US 8,278,688 B2
(45) Date of Patent: Oct. 2, 2012

(54) COMPOUND SEMICONDUCTOR DEVICE AND MANUFACTURING METHOD THEREOF

(75) Inventors: Toshihiro Ohki, Kawasaki (JP); Toshihide Kikkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/639,539

(22) Filed: Dec. 16, 2009

(65) Prior Publication Data
US 2010/0155741 A1    Jun. 24, 2010

(30) Foreign Application Priority Data
Dec. 19, 2008 (JP) .................. 2008-324759

(51) Int. Cl.
*H01L 29/66* (2006.01)

(52) U.S. Cl. ...................... 257/194; 257/192

(58) Field of Classification Search ............. 438/172, 438/167, 285, 518, 590, 604
See application file for complete search history.

(56) References Cited

U.S. PATENT DOCUMENTS
5,929,467 A * 7/1999 Kawai et al. .................. 257/192
2009/0008677 A1 * 1/2009 Kikkawa ....................... 257/194

FOREIGN PATENT DOCUMENTS
JP         2002-359256 A    12/2002
WO    WO 2007-108055        9/2007

* cited by examiner

*Primary Examiner* — Ha Tran T Nguyen
*Assistant Examiner* — Valerie N Brown
(74) *Attorney, Agent, or Firm* — Fujitsu Patent Center

(57) ABSTRACT

A compound semiconductor device includes a carrier transit layer including GaN formed over a substrate; a carrier supply layer including GaN formed over the carrier transit layer; a source electrode and a drain electrode formed over the carrier supply layer; a first compound semiconductor layer including N in which a first opening is formed and that is located between the source electrode and the drain electrode over the carrier supply layer; a gate electrode extending from within the first opening to above the first compound semiconductor layer; and an insulator layer having a second opening that is smaller than the first opening, and insulating the gate electrode and the first compound semiconductor layer within the first opening. The gate electrode extends from within the second opening to above the first compound semiconductor layer.

14 Claims, 11 Drawing Sheets

COMPOUND SEMICONDUCTOR DEVICE AND MANUFACTURING METHOD THEREOF

CROSS-REFERENCE TO RELATED APPLICATIONS

This application is based upon and claims the benefit of priority of the prior Japanese Patent Application No. 2008-324759, filed on Dec. 19, 2008, the entire contents of which are incorporated herein by reference.

FIELD

Certain aspects of the embodiments discussed herein are related to a semiconductor device and the manufacturing method thereof.

BACKGROUND

AlGaN/GaN type high electron mobility transistors (HEMTs) that achieve high power operation, high-speed switching, and high-temperature operation have been drawing attention as field-effect transistors that may be used for a portable base station and satellite communication, etc.

Many conventional GaN type HEMTs are normally-on types. In the normally-on type GaN type HEMTs, current continues to flow when a failure occurs. Thus, in order to ensure safety at a failure, a normally-off GaN type HEMT is desirable. To this end, a GaN HEMT with a recess gate structure (for example, refer to FIG. 1) has been proposed to obtain a positive threshold voltage. In a GaN type HEMT illustrated in FIG. 1, a protective layer 104 including n-type GaN is formed over an electron supply layer 103 including n-type AlGaN. An AlN layer 105 with a recess (an opening) is formed over the protective layer 104. A SiN film 106 is formed over the AlN layer 105. A gate electrode 111g is formed over the recess and a source electrode 111s and a drain electrode 111d are formed over the protective layer 104 so that the gate electrode 111g is located between the source electrode 111s and drain electrode 111d. In this technique, intentionally, no insulator layer is sandwiched between the protective layer 104 and the gate electrode 111g in order to prevent a threshold voltage becoming high.

Although this structure allows a normally-off operation, it is difficult to suppress a phenomenon called a current collapse caused by concentration of an electric field.

SUMMARY

According to an aspect of the invention, a compound semiconductor device includes a carrier transit layer including GaN formed over a substrate; a carrier supply layer including GaN formed over the carrier transit layer; a source electrode and a drain electrode formed over the carrier supply layer; a first compound semiconductor layer including N in which a first opening is formed and that is located between the source electrode and the drain electrode over the carrier supply layer; a gate electrode extending from within the first opening to above the first compound semiconductor layer; and an insulator layer having a second opening that is smaller than the first opening, and insulating the gate electrode and the first compound semiconductor layer within the first opening, wherein the gate electrode extends from within the second opening to above the first compound semiconductor layer.

According to an another aspect of the invention, a compound semiconductor device manufacturing method including, forming a carrier transit layer including GaN over a substrate, forming a carrier supply layer including GaN over the carrier transit layer, forming a source electrode and a drain electrode over the carrier supply layer, forming a first compound semiconductor layer including N in which a first opening is formed and that is located between the source electrode and the drain electrode over the carrier supply layer, forming a gate electrode extending from within the first opening above the first compound semiconductor layer, wherein before forming the gate electrode, forming an insulator layer provided with a second opening smaller than the first opening and that insulates the gate electrode and the first compound semiconductor layer within the first opening, and wherein the gate electrode is extending from within the second opening above the first compound semiconductor layer.

According to an another aspect of the invention, a compound semiconductor device including, a carrier transit layer including GaN formed over a substrate, a carrier supply layer including GaN formed over the carrier transit layer, a source electrode and a drain electrode formed over the carrier supply layer, a first compound semiconductor layer including N in which an opening is formed and that located between the source electrode and the drain electrode over the carrier supply layer, a gate electrode extending from within the opening above the first compound semiconductor layer, and a sidewall formed on a side part of the opening and insulates the gate electrode and the first compound semiconductor layer within the opening.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

Figure 2:
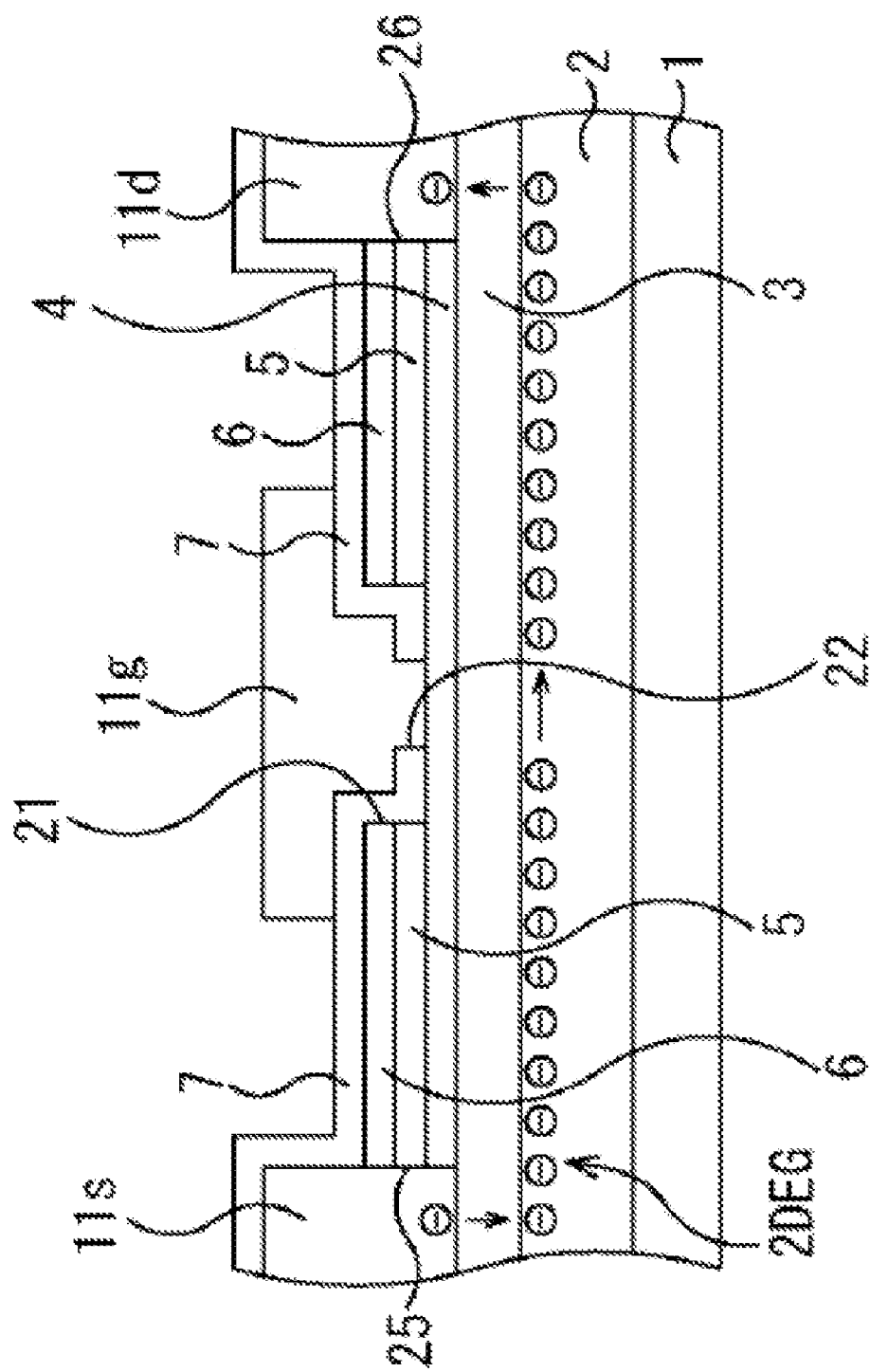
FIG. 2 is a sectional view illustrating a GaN type HEMT structure according to the first embodiment.

A first embodiment will be described. FIG. 2 is a sectional view illustrating a GaN type HEMT (compound semiconductor device) structure according to the first embodiment.

In the first embodiment, a carrier transit layer 2 including non-doped GaN with a thickness of approximately 3 μm is formed over a substrate 1 including, for example, SiC. A carrier supply layer 3 including n-type AlGaN with a thickness of approximately 30 nm is formed over the carrier transit layer 2. The carrier supply layer 3 is doped, for example, with approximately $5\times10^{18}$ cm$^{-3}$ Si. Moreover, a protective layer 4 including n-type GaN with a thickness of approximately 10 nm is formed over the carrier supply layer 3. The protective layer 4 is doped, for example, with approximately $5\times10^{18}$ cm$^{-3}$ Si. A first compound semiconductor layer 5 including non-doped AlN with a thickness of approximately 2 nm and a second compound semiconductor layer 6 including n-type GaN with a thickness of approximately 2 nm are formed over the protective layer 4. The second compound semiconductor layer 6 is doped, for example, with approximately $5\times10^{18}$ cm$^{-3}$ Si. An opening 21 for a gate electrode is formed in the first compound semiconductor layer 5 and the second compound semiconductor layer 6. Moreover, an opening 25 for a source electrode 11s and an opening 26 for a drain electrode 11d are formed with the opening 21 in between. A SiN film 7 with a thickness of 5 nm to 500 nm, for example, a SiN film 7 with a thickness of 100 nm is formed over the second compound semiconductor layer 6 and in the opening 21. An opening 22 is formed in the SiN film 7 within the opening 21.

A gate electrode 11g is formed over the SiN film 7 and is wider than the opening 21. The gate electrode 11g is wider than the opening 21, for example, by approximately 50 nm to 10 μm. The SiN film 7 is in contact with the protective layer 4 through the opening 21 and the opening 22. Moreover, a source electrode 11s is formed in the opening 25 and a drain electrode 11d is formed in the opening 26. The source electrode 11s and the drain electrode 11d include, for example, a Ta film with a thickness of approximately 10 nm and an Al film with a thickness of approximately 300 nm formed over the Ta film. The gate electrode 11g includes for example, a Ni film and an Au film formed over the Ni film.

According to the first embodiment, a piezoelectric effect is caused by a lattice mismatch in the vicinity of the interface between the carrier supply layer 3 and the carrier transit layer 2. Thus, positive polarization charges are generated and electrons are induced in the vicinity of the interface between the carrier transit layer 2 and the carrier supply layer 3. As a result, a two-dimensional electron gas layer (2DEG) is generated.

A gate leak current from the sides of the gate electrode 11g may be prevented because the SiN film 7 covers the sides of the gate electrode 11g as an insulator layer. Accordingly, sufficient output power and reliability may be achieved, and a high breakdown strength may be obtained.

Figure 1:
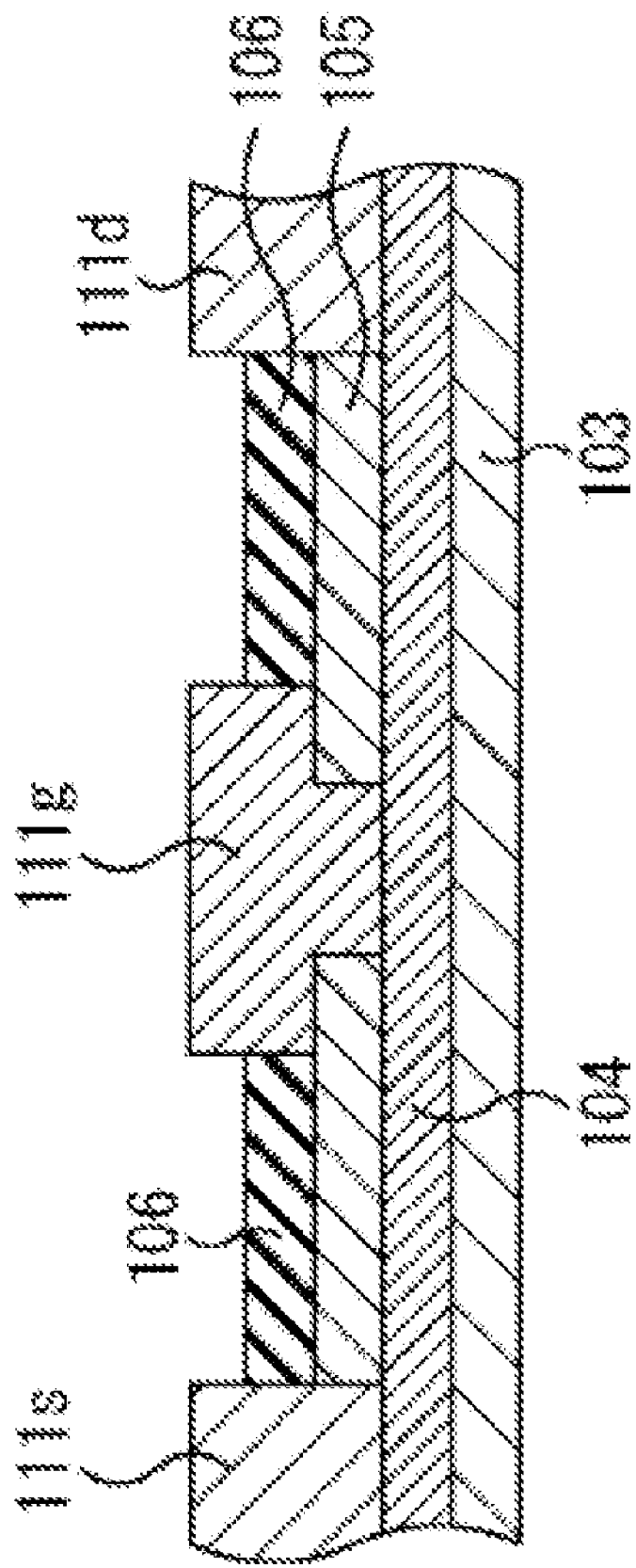
FIG. 1 is a sectional view illustrating a conventional GaN type HEMT structure.

Moreover, in the conventional structure illustrated in FIG. 1, the AlN layer 105 is in contact with the gate electrode 111g, and a gate leak current may be generated at the interface between the AlN layer 105 and the gate electrode 111g. However, according to this embodiment, the first compound semiconductor layer 5 and the gate electrode 11g are insulated by the SiN film 7. Thus, the gate leak current may be reduced.

Figure 3:
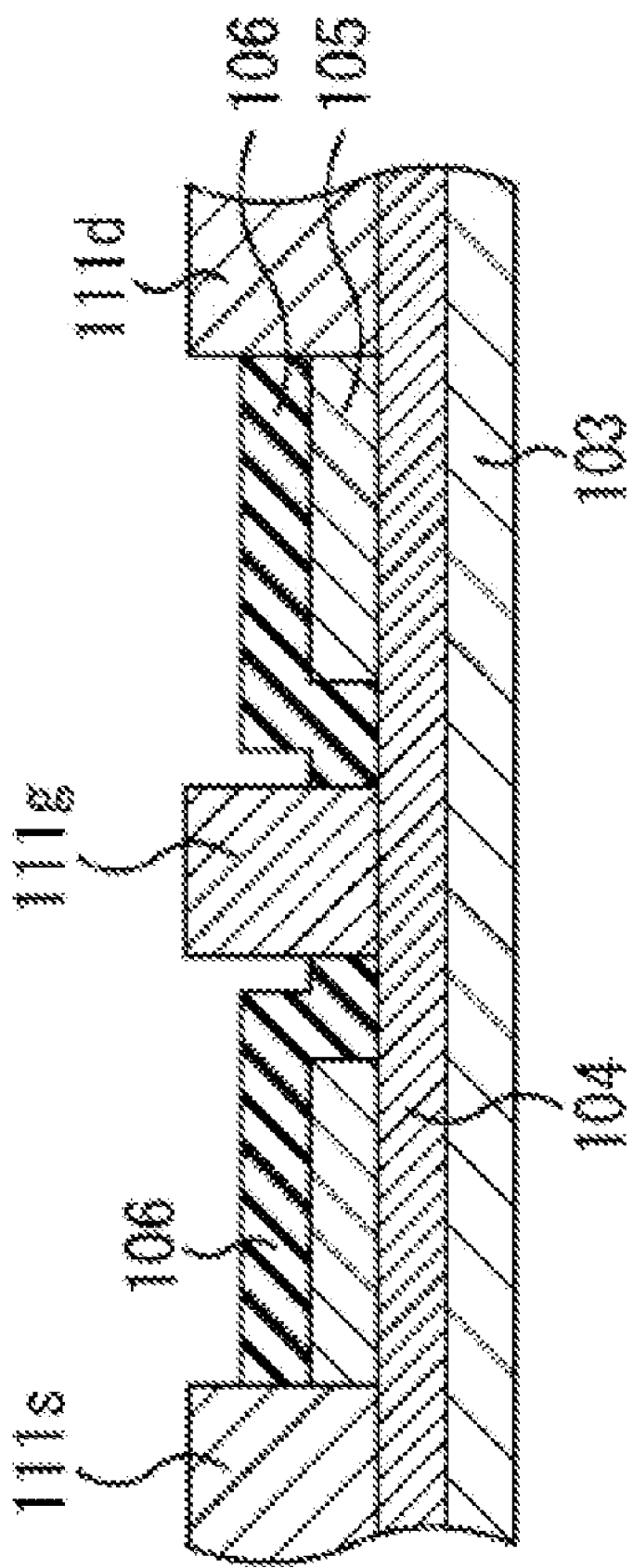
FIG. 3 is a sectional view illustrating an example of modification of the GaN type HEMT illustrated in FIG. 1.

The conventional structure illustrated in FIG. 1 may be modified to a structure illustrated in FIG. 3 in which an opening for a gate electrode 111g is made wider in order to simply insulate the AlN layer 105 and the gate electrode 111g. However, the inventors of this application tested the characteristics of such structure and found that the on-resistance may increase during operation which is called current collapse. Concentration of an electric field during operation is maximized at a drain end of the gate electrode 111g; however in the structure illustrated in FIG. 3, many traps generated by damages caused during recess etching exist where the concentration of an electric field is maximized. In other words, many traps are generated on the surface of the protective layer 104 when an opening (a recess) for the gate electrode 111g is formed. In the structure illustrated in FIG. 3, the surface where many traps are generated is where a concentration of the electric field is generated. If many traps exist at a place where the concentration of the electric field is maximized, many electrons are captured in the traps and such electrons may have a substantial influence on two-dimensional electron gas (2DEG) and thereby on-resistance is increased.

In contrast, in the first embodiment illustrated in FIG. 2, the gate electrode 11g extends over the edges of the opening 21 toward the source electrode 11s and the drain electrode 11d, thus, the concentration of an electric field during operation has an external value even on the SiN film 7. Therefore, an electric field in a region where many traps exist is reduced. As a result, electrons are less likely to be captured by traps on the surface of the protective layer 4, thereby current collapse is less likely to be generated.

Figure 4:
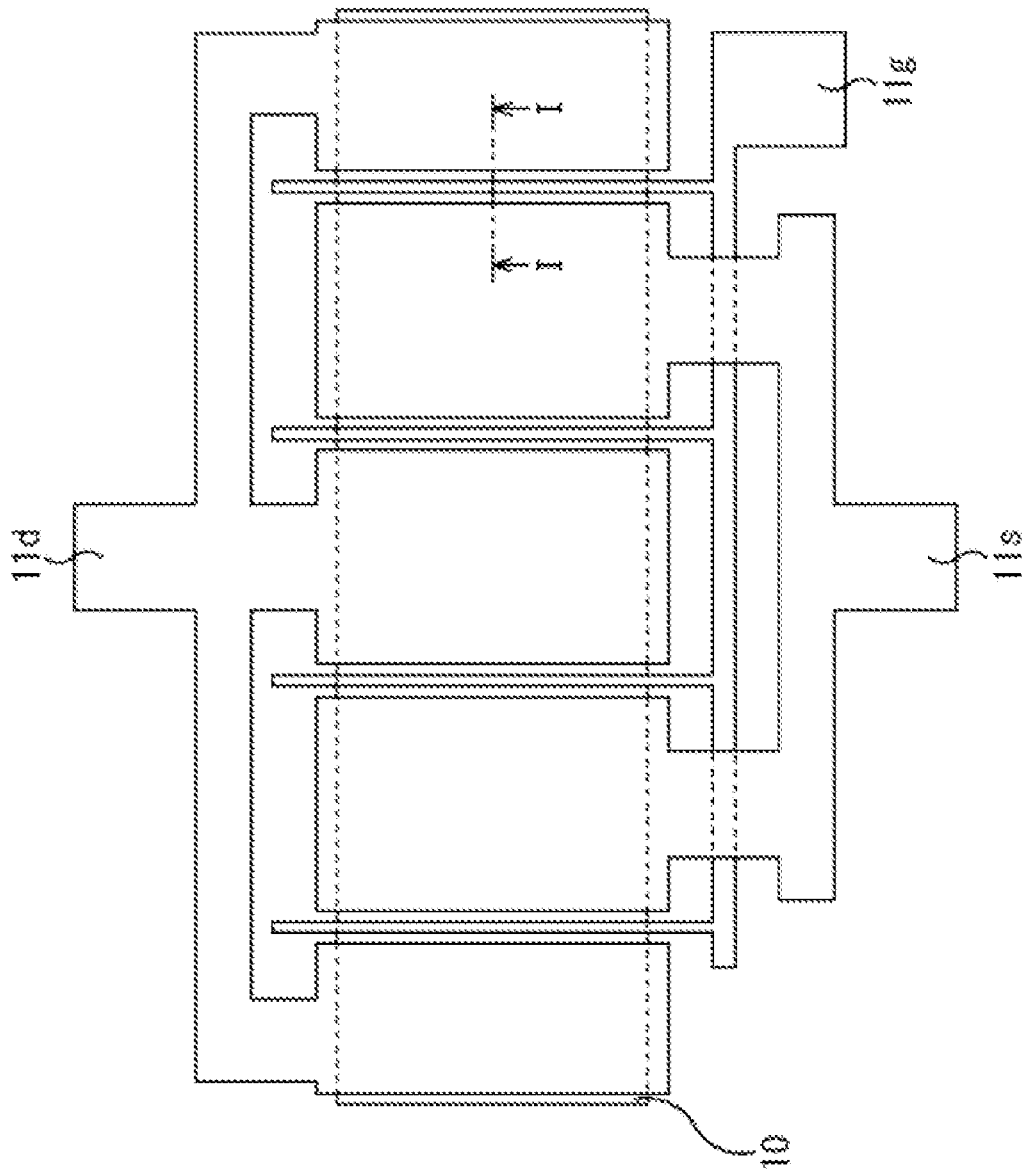
FIG. 4 is a plain view illustrating the Gan type HEMT structure according to the first embodiment.

A layout viewed from the top surface of the substrate 1 may appear, for example, as illustrated in FIG. 4. The planar shape of the gate electrode 11g, the source electrode 11s, and the drain electrode 11d is shaped like a comb, and the source electrode 11s and the drain electrode 11d are alternately arranged. The gate electrode 11g is located between the drain electrode 11d and the source electrode 11s. By employing a multi-finger gate structure as described above, outputs may be improved. FIG. 2 is a sectional view along the line I-I in FIG. 4. An active region 10 includes a carrier transit layer 2 and a carrier supply layer 3 and the peripheral area of the active region 10 is made to be an inactive region by ion implantation or mesa etching etc.

A monolithic microwave integrated circuit (MMIC) may be configured by providing a resistive element and a capacitor and the like together with the above described GaN type HEMT over the substrate 1.

Now, a method for manufacturing a GaN type HEMT (compound semiconductor device) according to the first embodiment will be described. FIGS. 5A to 5G are sectional views illustrating a method to manufacture a GaN type HEMT according to the first embodiment.

Figure 5A:
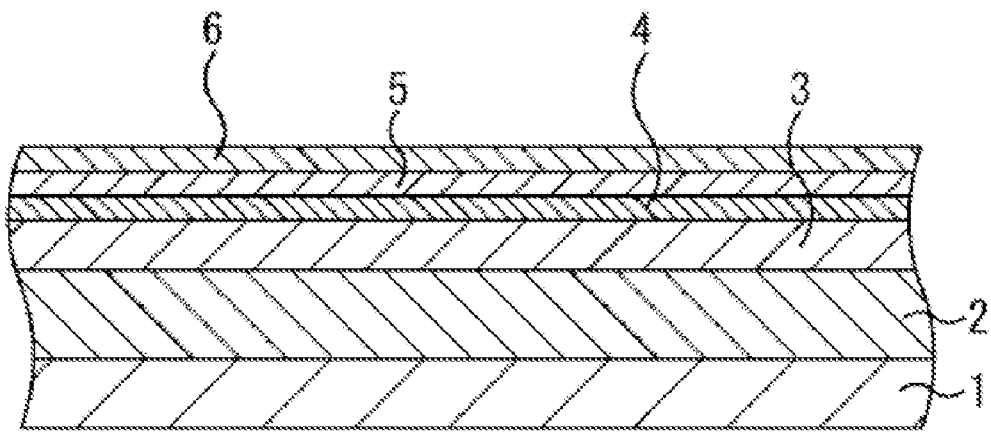
FIGS. 5A to 5G are sectional views illustrating a method to manufacture the GaN type HEMT according to the first embodiment.

According to the first embodiment, as illustrated in FIG. 5A, the carrier transit layer 2 including GaN is formed over the substrate 1. Then, the carrier supply layer 3 including n-type AlGaN is formed over the carrier transit layer 2. After that, the protective layer 4 including n-type GaN is formed over the carrier supply layer 3. Moreover, the first compound semiconductor layer 5 including non-doped AlN is formed over the protective layer 4. Then, the second compound semiconductor layer 6 including n-type GaN is formed over the first compound semiconductor layer 5. The carrier transit layer 2, the carrier supply layer 3, the protective layer 4, the first compound semiconductor layer 5, and the second compound semiconductor layer 6 may be formed by a crystal growth method such as a metal organic vapor phase epitaxy (MOVPE).

Figure 5B:
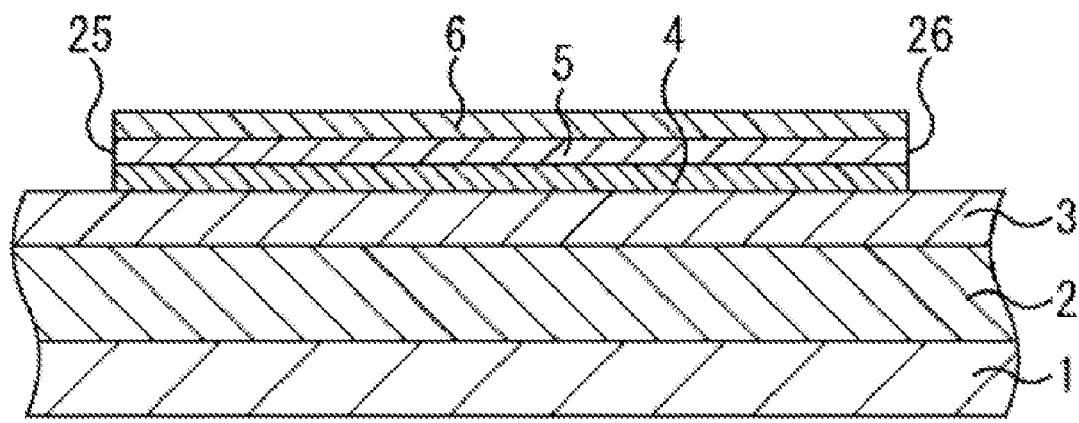

On the second compound semiconductor layer 6, a resist pattern (not illustrated) is formed to open an area where a source electrode 11s and a drain electrode 11d are to be formed. Then, the second compound semiconductor layer 6, the first compound semiconductor layer 5, and the protective layer 4 are etched using the resist pattern as a mask to form the opening 25 for the source electrode 11s and the opening 26 for the drain electrode 11d as illustrated in FIG. 5B. As an etching method, dry etching using, for example, chlorine-base gas may be employed. As for the depth of the opening 25 and the opening 26, a part of the protective layer 4 may be kept or a part of the carrier supply layer 3 may be removed. After etching the second compound semiconductor layer 6, the first compound semiconductor layer 5 may be removed by wet etching using acid and the protective layer 4 may be kept. In other words, the depth of the opening 25 and the opening 26 do not necessarily match the total thickness of the second compound semiconductor layer 6, the first compound semiconductor layer 5, and the protective layer 4.

Figure 5C:
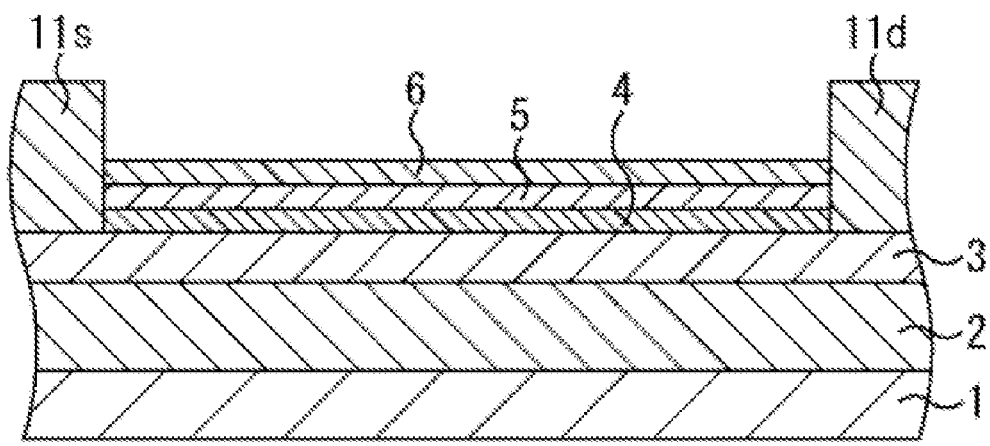

As illustrated in FIG. 5C, the source electrode 11s is formed in the opening 25 and the drain electrode 11d is formed in the opening 26 by a lift-off method. For forming the source electrode 11s and the drain electrode 11d, for example, Ta and Al are deposited, and then the Ta and Al deposited on the resist pattern are removed together with the resist pattern. In other words, a lift-off process is performed. Then, an ohmic property is established by thermal processing in a nitrogen atmosphere 400° C. to 1000° C., for example, at 550° C.

Figure 5D:
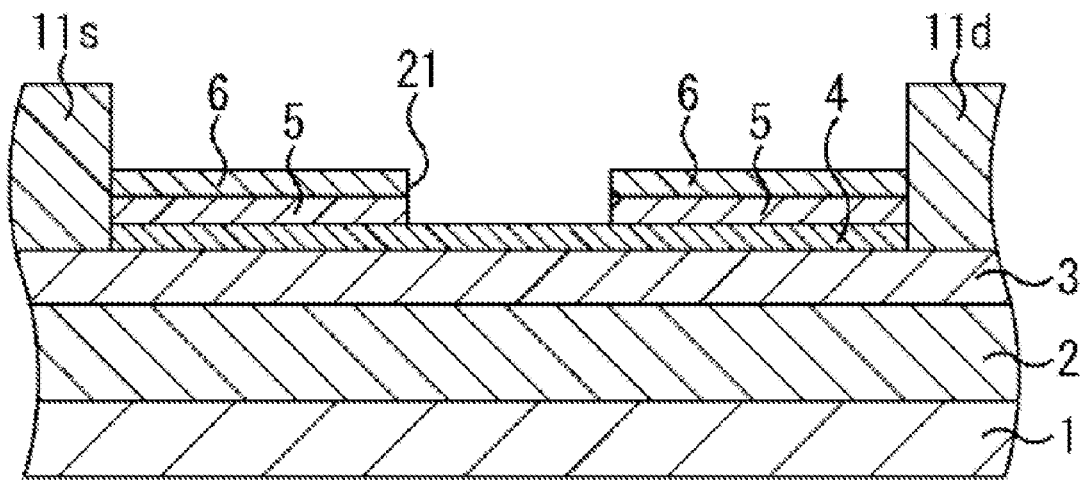

After forming the source electrode 11s and the drain electrode 11d, a resist pattern (not illustrated) is formed to open an area where the opening 21 is to be formed. Then, as illustrated in FIG. 5D, by applying etching using the resist pattern, the opening 21 is formed in the second compound semiconductor layer 6 and the first compound semiconductor layer 5. The width of the opening 21 is not specifically restricted; for example, the width may be approximately 10 nm to 5 μm. As for this etching, for example, wet etching using an acid may be applied. Then, the resist pattern is removed. Such etching may not etch the protective layer 4, thus uniform etching on the wafer surface may be achieved.

Figure 5E:
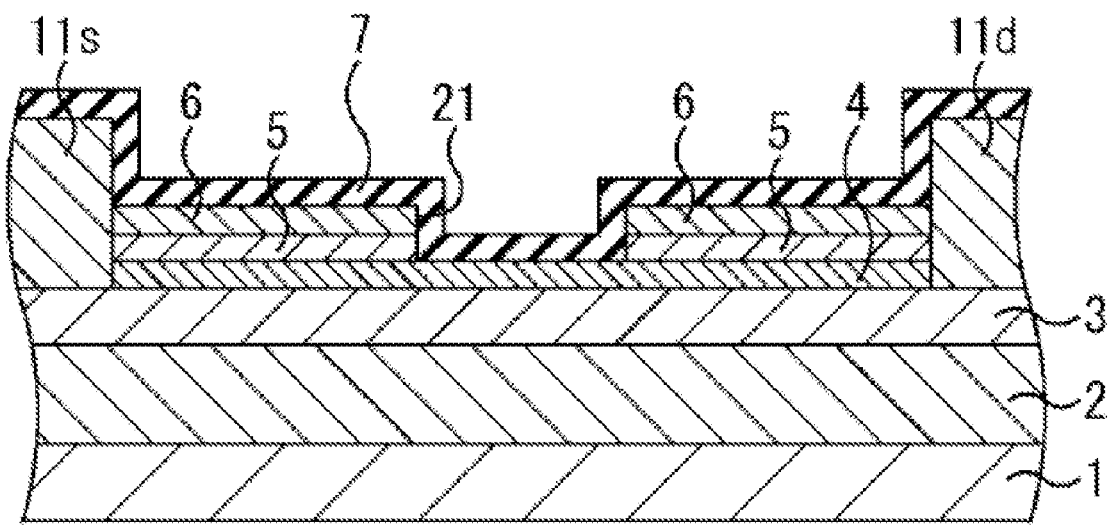

Thereafter, as illustrated in FIG. 5E, the SiN film 7 is formed in the opening 21, over the second compound semiconductor layer 6, the source electrode 11s, and the drain electrode 11d. The SiN film 7 is formed, for example, by a plasma CVD method.

Figure 5F:
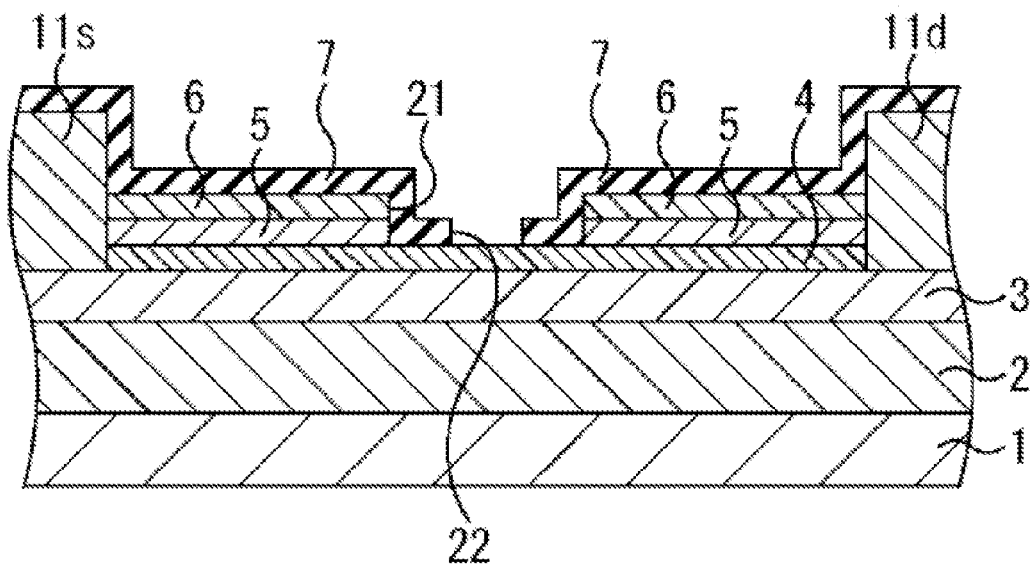

A resist pattern (not illustrated) is formed to open an area where the opening 22 is to be formed. Then, as illustrated in FIG. 5F, the opening 22 is formed in the SiN film 7 by etching using the resist pattern. The width of the opening 22 may not be specifically restricted as long as the width of the opening 22 is smaller than the width of the opening 21, and it is preferable that the width of the opening 22 be, for example, approximately 0.1 μm to 0.3 μm when the width of the opening 21 is approximately 0.5 μm. As for the etching, dry etching using, for example, fluorine-base gas or wet etching using an acid may be applied. Then, the resist pattern is removed.

Figure 5G:
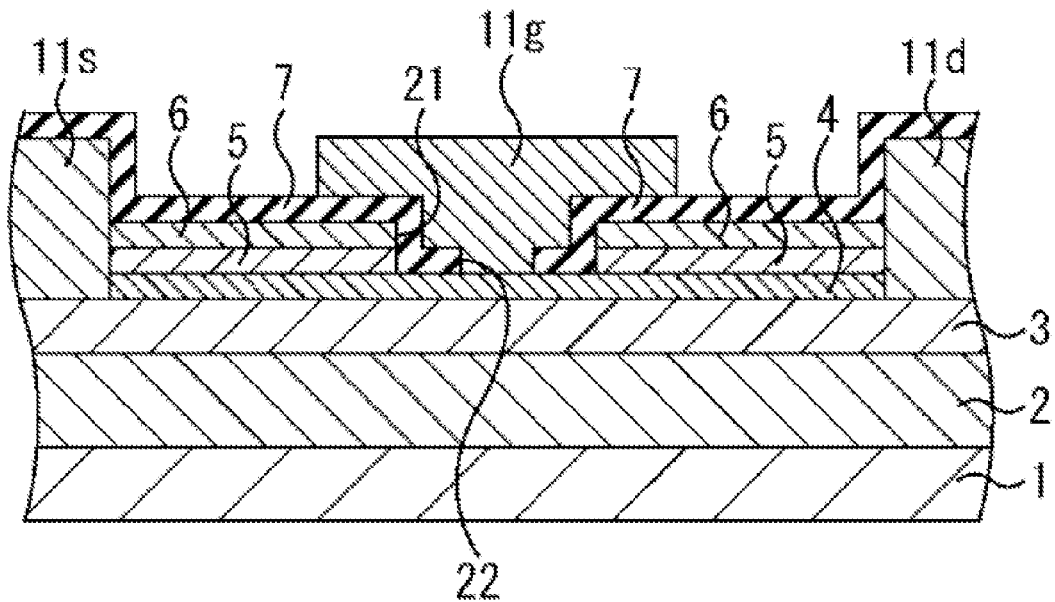

Thereafter, a resist pattern (not illustrated) is formed to open an area where the gate electrode 11g is to be formed. For example, Ni and Au are deposited, then the Ni and Au deposited on the resist pattern are removed together with the resist pattern. In other words, the gate electrode 11g is formed by a lift-off process as illustrated in FIG. 5G. The width of the gate electrode 11g may not be specifically restricted as long as the width of the gate electrode 11g is larger than the width of the opening 21, and it is preferable that the width of the gate electrode 11g be approximately 1 μm when the width of the opening 21 is approximately 0.5 μm.

According to the above manufacture method, etching selectivity of wet etching between the first compound semiconductor layer 5 including non-doped AlN and the protective layer 4 including n-type GaN are high, thus, the first compound semiconductor layer 5 may be processed with high accuracy. Accordingly, the gate electrode 11g with high reproducibility may be formed with high accuracy.

Figure 6:
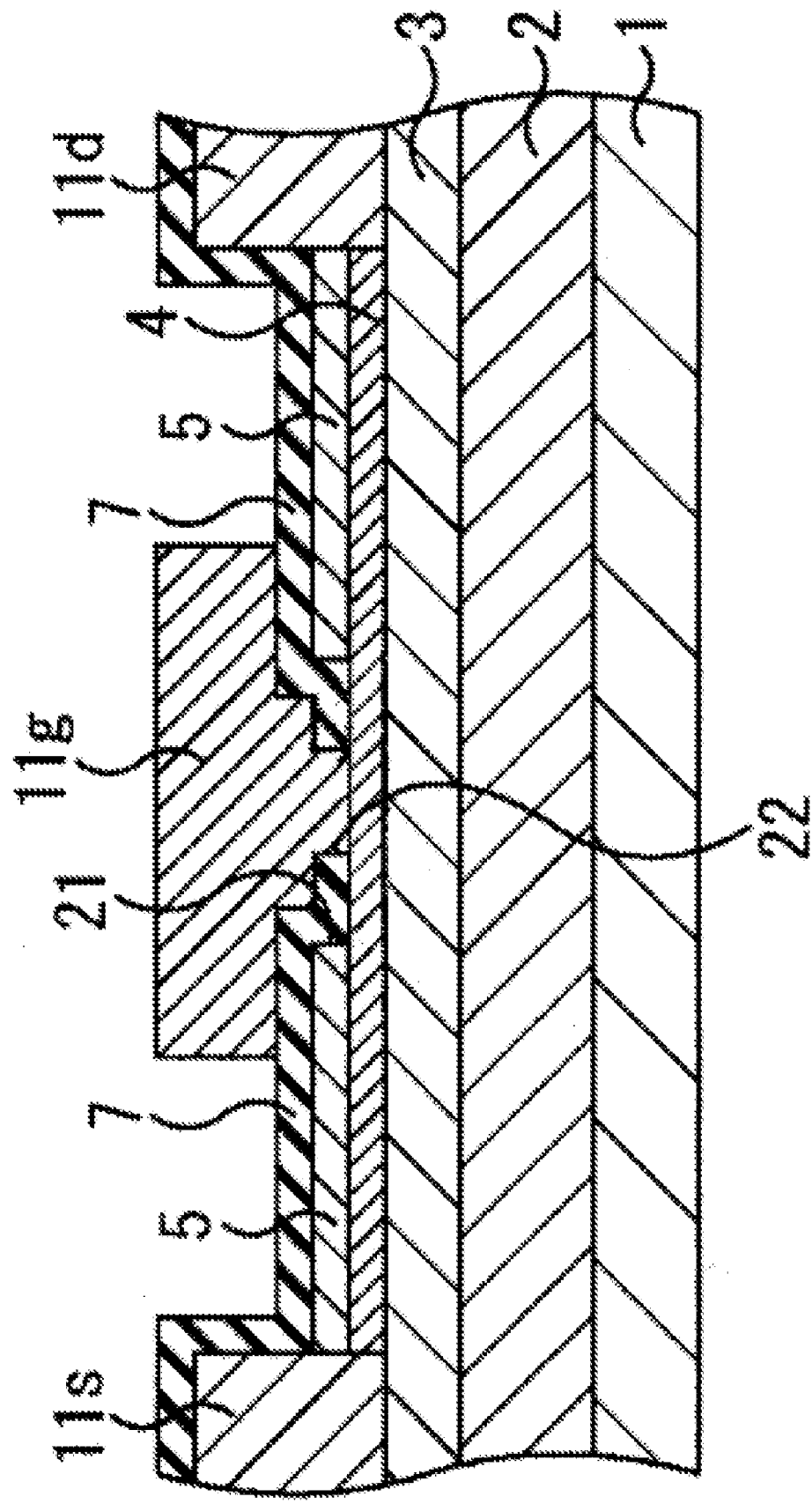
FIG. 6 is a sectional view illustrating an example of modification of the first embodiment.

As illustrated in FIG. 6, the second compound semiconductor layer 6 according to the first embodiment may be omitted.

Second Embodiment

Figure 7A:
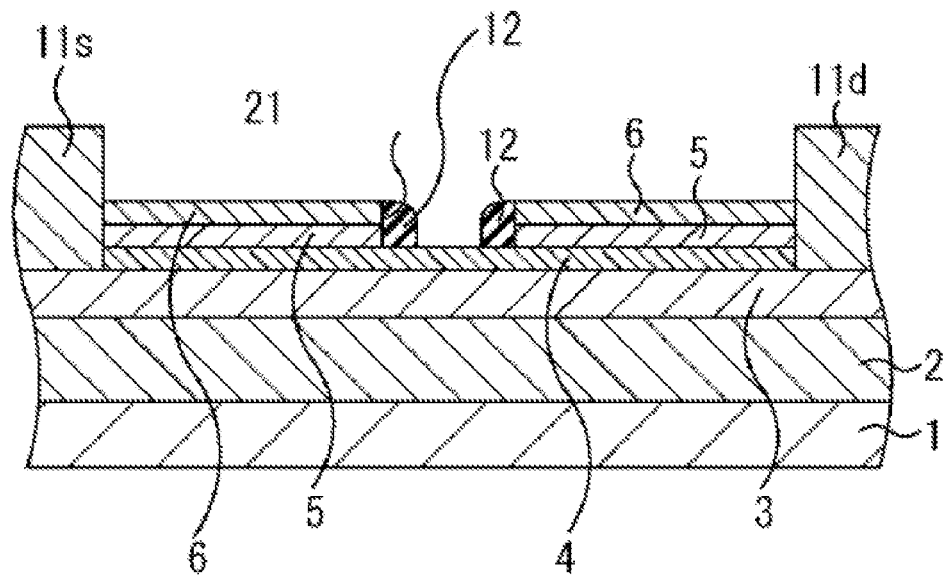
FIGS. 7A to 7C are sectional views illustrating a method to manufacture a GaN HEMT according to the second embodiment.
Figure 7B:
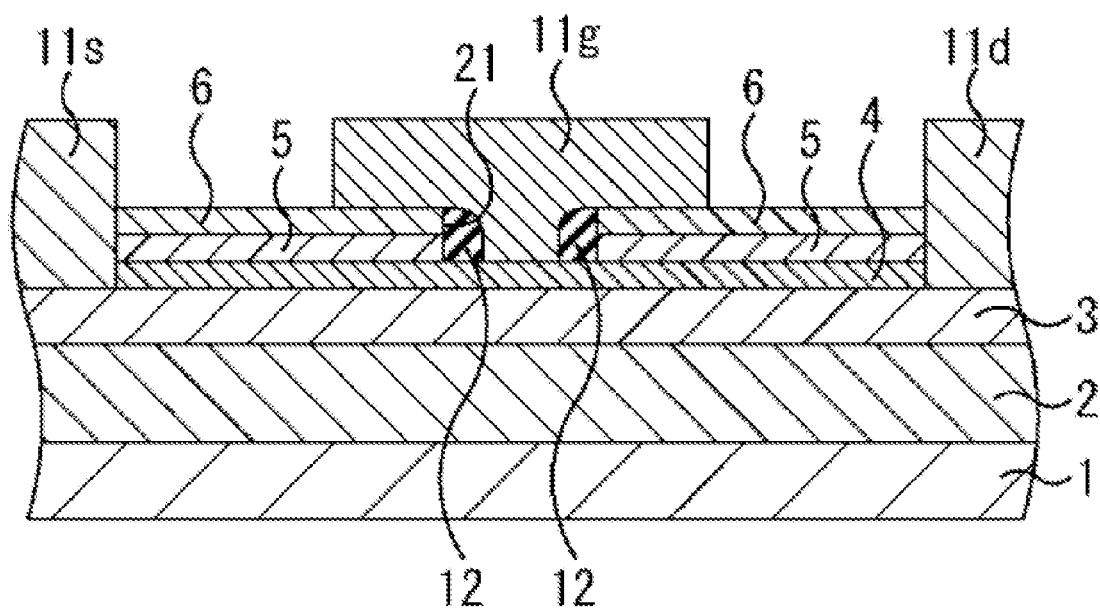
Figure 7C:
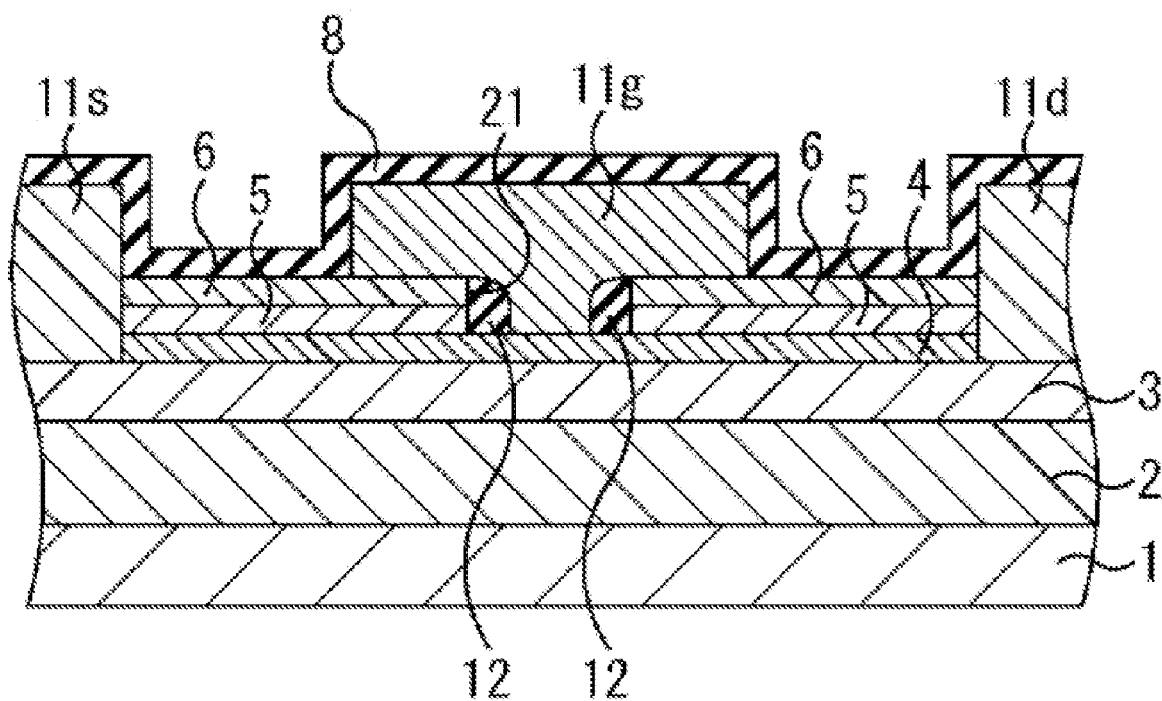

Now, a second embodiment will be described. FIGS. 7A to 7C are sectional views illustrating processes of a method to manufacture a GaN HEMT (compound semiconductor device).

In the second embodiment, processes up to forming a SiN film 7 is performed as in the first embodiment (refer to FIG. 5E). Then, anisotropic dry etching using, for example, fluorine-base gas is applied to the SiN film 7. As a result, as illustrated in FIG. 7A, side walls 12 are formed at both sides of the opening 21. A space between the side walls 12 may be approximately 0.1 μm to 0.3 μm. This space may be adjusted depending on the width of the opening 21 and the thickness of the SiN film 7.

A resist pattern (not illustrated) is formed to open an area where a gate electrode 11g is to be formed. For example, Ni and Au are deposited, then the Ni and Au deposited on the resist pattern are removed together with the resist pattern. In other words, the gate electrode 11g is formed as illustrated in FIG. 7B by a lift-off process. The width of the gate electrode 11g may not be restricted as long as the width of the gate electrode 11g is larger than the width of the opening 21.

As illustrated in FIG. 7C, a SiN film 8 is formed over the gate electrode 11g, the second compound semiconductor layer 6, the source electrode 11s, and the drain electrode 11d. The SiN film 8 is formed, for example, by a plasma chemical vapor deposition (CVD) method. The thickness of the SiN film 8 is similar to that of SiN film 7, approximately 5 nm to 500 nm, for example 100 nm.

The GaN HEMT manufactured by above described method may achieve similar effects as the GaN HEMT in the first embodiment.

Third Embodiment

Figure 8A:
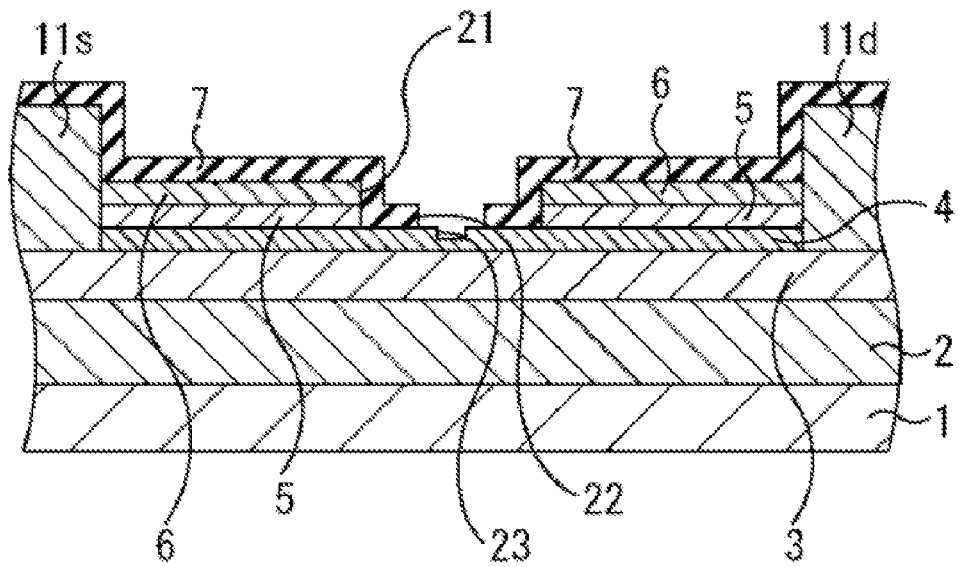
FIGS. 8A and 8B are sectional views illustrating a method to manufacture a GaN HEMT according to the third embodiment.
Figure 8B:
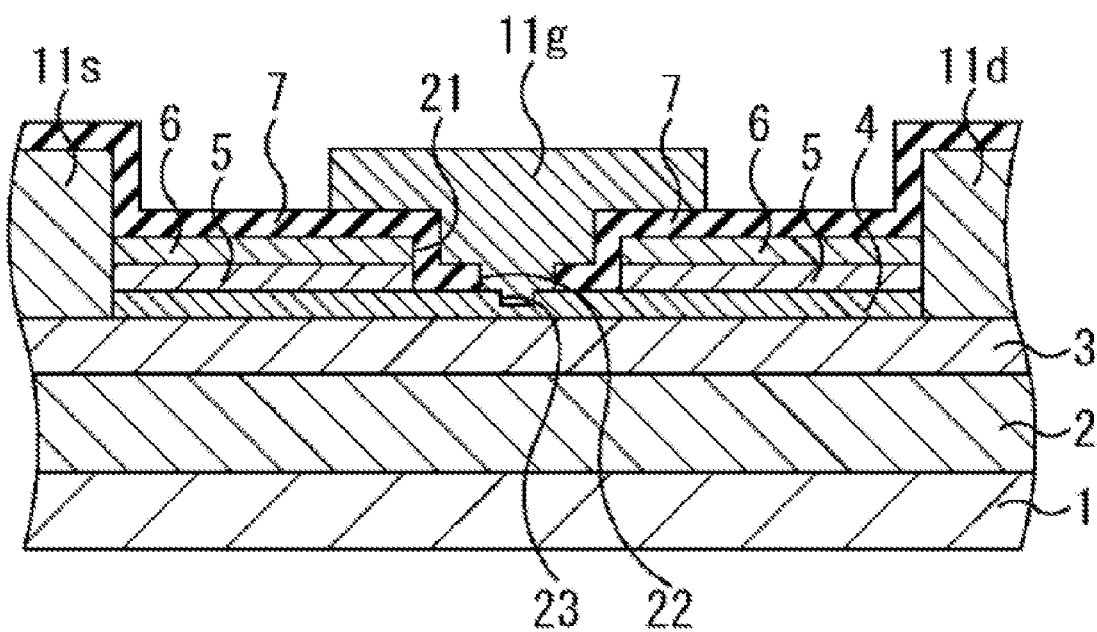

Now a third embodiment will be described. FIGS. 8A and 8B are sectional views illustrating a method to manufacture a GaN HEMT (compound semiconductor device).

According to the third embodiment, processes up to forming an opening 22 are performed (refer to FIG. 5F). A resist pattern (not illustrated) for opening the inside of an opening 22 is formed. Then a protective layer 4 is etched using the resist pattern as a mask to form a concave part 23 on the surface of the protective layer 4 as illustrated in FIG. 8A. Then the resist pattern is removed.

Thereafter, a resist pattern (not illustrated) is formed to open an area where a gate electrode 11g is to be formed. For example, Ni and Au are deposited, then the Ni and Au deposited on the resist pattern are removed together with the resist pattern. In other words, the gate electrode 11g is formed as illustrated in FIG. 8B by a lift-off process. The width of the gate electrode 11g may not be specifically restricted as long as the width of the gate electrode 11g is larger than the width of the opening 21.

The GaN HEMT manufactured by the above described method may achieve similar effects as the GaN HEMT in the first embodiment.

Moreover, according to this embodiment, a gate recess has a two-stage structure providing more points where the electric field is concentrated than the first embodiment, thereby current collapse may be further suppressed.

The depth of the concave part 23 is not specifically restricted and the depth may match, for example, the thickness of the protective layer 4. In other words, the portion exposed from the resist pattern of the protective layer 4 may all be removed.

As in the first embodiment, the second compound semiconductor layer 6 may be omitted in the second and the third embodiments as well (refer to FIG. 6).

In any of the embodiments, a substrate 1 may include, for example, a silicon carbide (SiC) substrate, a sapphire substrate, a silicon substrate, a GaN substrate, or a GaAs substrate. The substrate 1 may be conductive, semi-insulating, or insulating.

Structures of the gate electrode 11g, the source electrode 11s, and the drain electrode 11d are not limited to those described in the above embodiments. For example, these elements may be composed of a single layer. Moreover, methods to form these elements are not limited to the lift-off method. Furthermore, thermal processing after formation of the source electrode 11s and the drain electrode 11d may be omitted as long as an ohmic property is achieved. Furthermore, thermal processing may be applied to the gate electrode 11g as well.

Thicknesses and materials of each layer are not limited to those described in above embodiments. For example, insulating AlN (aluminum nitride) may be used for an insulation film that is located inside of the opening 21, or a laminated film may be used that is formed of AlN in contact with sides of the opening 21 and a SiN (silicon nitride) located inside of the AlN. In order to obtain a laminated film structure, side walls that include SiN may be formed by processing similarly to the second embodiment before forming the SiN film 7 disclosed in the first embodiment, or aluminum oxide may be included in the insulation film located inside of the opening 21. As described above, oxide or nitride, or a laminate structure of oxide and nitride may be used as an insulation film located inside of the opening 21.

A part of the protective layer 4 that is in contact with the gate electrode 11g may be etched in the first and the second embodiments. The etch depth may match the thickness of the protective layer 4, or may be shallower than the thickness of the protective layer 4. Etching may be applied so as to reach the carrier supply layer 3. It is preferable, however, that this etching is applied uniformly.

Even if a threshold voltage becomes negative, suppression of a current collapse, and reductions of on-resistance and gate leak current may be achieved, thus this disclosure may be applied to a compound semiconductor device that performs normally-on operations.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A compound semiconductor device comprising: a carrier transit layer including GaN formed over a substrate; a carrier supply layer including GaN formed over the carrier transit layer; a source electrode and a drain electrode formed over the carrier supply layer; a first compound semiconductor layer formed over the carrier supply layer, the first compound semiconductor layer including N (nitrogen) and including a first that is located between the source electrode and the drain electrode a protective layer including GaN formed between the carrier supply layer and the gate electrode and directly in contact with the gate electrode, the protective layer being between the carrier supply layer and the source electrode and the drain electrode, the protective layer including a concave part within the first opening and directly in contact with the gate electrode in the concave part; a gate electrode extending from within the first opening and the concave part to above the first compound semiconductor layer; and an insulator layer including a second opening that is smaller than the first opening and larger than the concave part of the protective layer, and insulating the gate electrode and the first compound semiconductor layer within the first opening, wherein the gate electrode extends from within the second opening to above the first compound semiconductor layer.

2. The compound semiconductor device according to claim 1, wherein the insulator layer extends above the first compound semiconductor layer.

3. The compound semiconductor device according to claim 1, wherein Si is doped in the protective layer.

4. The compound semiconductor device according to claim 1, wherein the first compound semiconductor layer includes AlN.

5. The compound semiconductor device according to claim 1, wherein the insulator layer includes at least one of silicon nitride, aluminum nitride, or aluminum oxide.

6. The compound semiconductor device according to claim 1 further comprising:
a second compound semiconductor layer including GaN formed over the first compound semiconductor layer.

7. A compound semiconductor device manufacturing method comprising: forming a carrier transit layer including GaN over a substrate; forming a carrier supply layer including GaN over the carrier transit layer; forming a protective layer which includes GaN over the carrier supply layer the protective layer including a concave part; forming a source electrode and a drain electrode over the carrier supply layer; forming a first compound semiconductor layer, the first compound semiconductor layer including N (nitrogen) and including a first opening that is located between the source electrode and the drain electrode the concave part being within the first opening; forming a gate electrode extending from within the first opening and the concave part to above the first compound semiconductor layer, and directly in contact with the protective layer in the first opening and concave part; forming, before forming the gate electrode, an insulator layer including a second opening that is smaller than the first opening and larger than the concave part of the protective layer, the insulator layer insulating the gate electrode and the first compound semiconductor layer.

8. The compound semiconductor device manufacturing method according to claim 7, wherein the insulator layer is formed so that the insulator layer extends above the first compound semiconductor layer.

9. The compound semiconductor device manufacturing method according to claim 7, wherein the protective layer is doped with Si.

10. The compound semiconductor device manufacturing method according to claim 7, wherein the first compound semiconductor layer includes AlN.

11. The compound semiconductor device manufacturing method according to claim 7, wherein the insulator layer includes at least one of silicon nitride, aluminum nitride, or aluminum oxide.

12. The compound semiconductor device manufacturing method according to claim 7 further comprising:
forming a second compound semiconductor layer including GaN over the first compound semiconductor layer between forming the first compound semiconductor layer and forming the gate electrode.

13. A compound semiconductor device comprising: a carrier transit layer including GaN formed over a substrate; a carrier supply layer including GaN formed over the carrier transit layer; a source electrode and a drain electrode formed over the carrier supply layer; a first compound semiconductor layer formed over the carrier supply layer, the first compound semiconductor layer including N (nitrogen) and including an opening that is located between the source electrode and the drain a protective layer including GaN formed between the carrier supply layer and the gate electrode and directly in contact with the gate electrode, the protective layer being between the carrier supply layer and the source electrode and the drain electrode, the protective layer including a concave part within the first opening and directly in contact with the gate electrode in the concave part; a gate electrode extending from within the opening to above the first compound semiconductor layer; and a side wall formed on a side part of the opening and insulating the gate electrode and the first compound semiconductor layer within the opening and exposing the protective layer.

14. The compound semiconductor device according to claim 13, wherein the side wall includes at least one of silicon nitride, aluminum nitride, or aluminum oxide.

* * * * *